(12) United States Patent
Takahashi et al.

(10) Patent No.: US 12,516,420 B2
(45) Date of Patent: Jan. 6, 2026

(54) CHEMICAL SOLUTION FOR REMOVING PRECIOUS METAL, METHOD FOR MANUFACTURING CHEMICAL SOLUTION, METHOD FOR TREATING SUBSTRATE, METHOD FOR MANUFACTURING SEMICONDUCTOR DEVICE

(71) Applicant: TOKYO OHKA KOGYO CO., LTD., Kanagawa (JP)

(72) Inventors: Kazuhiro Takahashi, Kanagawa (JP); Fusayo Saeki, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 248 days.

(21) Appl. No.: 18/528,283

(22) Filed: Dec. 4, 2023

(65) Prior Publication Data

US 2024/0191362 A1 Jun. 13, 2024

Related U.S. Application Data

(60) Provisional application No. 63/431,317, filed on Dec. 9, 2022.

(51) Int. Cl.
*C23F 1/30* (2006.01)

(52) U.S. Cl.
CPC ..................................... *C23F 1/30* (2013.01)

(58) Field of Classification Search
None
See application file for complete search history.

(56) References Cited

U.S. PATENT DOCUMENTS

2017/0222138 A1    8/2017  Park et al.
2018/0250660 A1*   9/2018  Li .......................... B01J 23/002
2022/0002881 A1*   1/2022  Kashiwagi ................ C23F 1/30

FOREIGN PATENT DOCUMENTS

| CN | 114260008 A | * | 4/2022 |
| CN | 115976519 A | * | 4/2023 |
| JP | 2016-092101 A | | 5/2016 |
| WO | 2016/068183 A1 | | 5/2016 |

* cited by examiner

*Primary Examiner* — Binh X Tran
(74) *Attorney, Agent, or Firm* — Rankin, Hill & Clark LLP

(57) ABSTRACT

A chemical solution for removing a precious metal includes a cerium-containing oxidizing agent (A), a metal component (B) including a transition metal other than cerium, and water, in which a content of the metal component (B) is less than $1.65 \times 10^{-3}$ parts by mass with respect to 1 part by mass of the cerium-containing oxidizing agent (A) in terms of the transition metal.

6 Claims, No Drawings

CHEMICAL SOLUTION FOR REMOVING PRECIOUS METAL, METHOD FOR MANUFACTURING CHEMICAL SOLUTION, METHOD FOR TREATING SUBSTRATE, METHOD FOR MANUFACTURING SEMICONDUCTOR DEVICE

Priority is claimed on U.S. Patent Application No. 63/431,317, filed on Dec. 9, 2022, the content of which is incorporated herein by inference.

BACKGROUND OF THE INVENTION

Field of the Invention

The present invention relates to a chemical solution for removing a precious metal, a method for manufacturing a chemical solution, a method for treating a substrate, and a method for manufacturing a semiconductor device.

Description of Related Art

A semiconductor device manufacturing process consists of various multi-stage processing steps. Such processing steps include a process of patterning semiconductor layers, electrodes, and the like by etching or the like. In recent years, following advances in the integration, speed, and the like of semiconductor devices, precious metals such as ruthenium (Ru) have come to be used for wiring and the like.

As a ruthenium-etching solution for etching ruthenium, for example, etching solutions containing orthoperiodic acid as an oxidizing agent have been proposed (PCT International Publication No. WO2010/68183 and Japanese Unexamined Patent Application, First Publication No. 2016-92101).

SUMMARY OF THE INVENTION

Along with the demand for wiring patterns using precious metals such as ruthenium, there is a demand for the development of chemical solutions having an excellent removal performance for these precious metals.

The present invention was made in view of the above circumstances and has an object of providing a chemical solution having a good removal performance for precious metals such as ruthenium, a method for manufacturing the chemical solution, a method for treating a substrate using the chemical solution, and a method for manufacturing a semiconductor device.

In order to solve the problems described above, the present invention adopted the configurations described below.

A first aspect of the present invention is a chemical solution for removing a precious metal including a cerium-containing oxidizing agent (A), a metal component (B) including transition metal atoms other than cerium, and water, in which a content of the transition metal atoms included in the metal component (B) is less than $1.65 \times 10^{-3}$ parts by mass with respect to 1 part by mass of the cerium-containing oxidizing agent (A).

A second aspect of the present invention is a method for manufacturing the chemical solution according to the first aspect, the method including a step for dissolving the cerium-containing oxidizing agent (A) and the metal component (B) in water to prepare a solution in which a content of the metal component (B) is less than $1.65 \times 10^{-3}$ parts by mass with respect to 1 pan by mass of the cerium-containing oxidizing agent (A).

A third aspect of the present invention is a method for treating a substrate, the method including a step for bringing the chemical solution according to the first aspect into contact with a substrate on which a precious metal is exposed on a surface to remove at least a part of the precious metal from the substrate.

A fourth aspect of the present invention is a method for manufacturing a semiconductor device, the method including a step for treating a substrate by the method for treating a substrate according to the third aspect.

According to the present invention, it is possible to provide a chemical solution having a good removal performance for precious metals such as ruthenium, a method for manufacturing the chemical solution, a method for treating a substrate using the chemical solution, and a method for manufacturing a semiconductor device.

DETAILED DESCRIPTION OF THE INVENTION (Chemical Solution)

The chemical solution according to the first aspect of the present invention includes a cerium-containing oxidizing agent (A), a metal component (B) including transition metal atoms other than cerium, and water. In the chemical solution of the present embodiment, the content of the transition metal included in the metal component (B) is less than $1.65 \times 10^{-3}$ parts by mass with respect to 1 part by mass of the cerium-containing oxidizing agent (A). The chemical solution of the present embodiment is used to remove precious metals.

<Cerium-Containing Oxidizing Agent (A): Component (A)>

The cerium-containing oxidizing agent (also referred to below as "component (A)") is an oxidizing agent that contains cerium (Ce). Examples of component (A) include cerium nitrate salts and cerium sulfate salts. Examples of cerium nitrate salts include cerium(IV) ammonium nitrate $((NH_4)_2Ce(NO_3)_6)$. Examples of cerium sulfate salts include cerium (IV) ammonium sulfate $((NH_4)_4Ce(SO_4)_4)$ cerium sulfate $(Ce(SO_4)_2)$, and the like. Component (A) may be used in the form of a hydrate. Examples of the hydrate-, of component (A) include cerium(IV) ammonium sulfate dihydrate $((NH_4)_4Ce(SO_4)_4 \cdot 2H_2O)$ and cerium(IV) sulfate tetrahydrate $(Ce(SO_4)_2 \cdot 4H_2O)$.

Among the above, as component (A), cerium (IV) ammonium nitrate, cerium (IV) ammonium sulfate dihydrate, or cerium (IV) sulfate tetrahydrate is preferable and cerium (IV) ammonium nitrate is more preferable.

The chemical solution of the present embodiment may include only one type of component (A), or may include two or more types.

The content of component (A) in the chemical solution of the present embodiment is not particularly limited and examples thereof include 0.01 to 60% by mass with respect to the total mars of the chemical solution. When the content of component (A) is within the above range, the precious metal removal performance of the chemical solution is further improved. The content of component (A) is preferably 0.1% by mass or more, more preferably 0.5% by mass or more, even more preferably 1% by mass or more, yet more preferably 1.5% by mass or more, and particularly preferably 2% by mass or more. The content of component (A) is preferably 55% by mass or less, more preferably 50% by mass or less, even more preferably 45% by mass or less, and particularly preferably 40% by mass or less. Examples of the content range of component (A) include 0.1 to 55% by mass, 1 to 50% by mass, 1 to 45% by mass, 1.5 to 45% by mass, 1.5 to 40% by mass, and 2 to 40% by mass.

<Metal Component (B): Component (13)>

The metal component including a transition metal other than cerium (also referred to below as "component (B)") is a simple substance or a compound including a transition metal other than cerium. "Transition metal" is a general term for elements existing between Group 3 elements and Group 12 elements in the periodic table. Examples of transition metals include scandium (Sc), titanium (Ti), vanadium (V), chromium (Cr), manganese (Mn), iron (Fe), cobalt (Co), nickel (Ni), copper (Cu), Zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), praseodymium (Pr), neodymium (Nd), promethium (Pm), samarium (Sm), europium (tau), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), anti gold (Au).

Among the above, the transition metal is preferably lanthanide (La, Pr, Nd, Pm, Sm, Eu, Gd, Tb, Dy, Ho, Er, Tm, Yb, Lu), iron, or copper, and more preferably at least one selected from the group consisting of lanthanum, praseodymium, neodymium, samarium, yttrium, iron, and copper.

Component (B) may be a simple substance of a transition metal or a compound including a transition metal, but is preferably a compound including a transition metal. Examples of compounds including a transition metal include transition metal salts, transition metal oxides, transition metal chlorides, and the like.

Examples of transition metal salts include carbonates, nitrates, sulfates, hydrochlorides, and the like. Specific examples of transition metal salts include lanthanum carbonate, praseodymium nitrate, neodymium nitrate, samarium nitrate, yttrium nitrate, iron sulfate, copper sulfate, and the like.

Examples of transition metal oxide, include lanthanum oxide, praseodymium oxide, neodymium oxide, samarium oxide, yttrium oxide, iron oxide, copper oxide, and the like.

Examples of transition metal chlorides include lanthanum chloride, praseodymium chloride, neodymium chloride, samarium chloride, yttrium chloride, iron chloride, copper chloride, and the like.

Component (B) may be used in the form of a hydrate.

The chemical solution of the present embodiment may include only one type of component (B), or may include two or more types thereof.

The content of component (B) in the chemical solution of the present embodiment is less than $1.65 \times 10^{-3}$ parts by mass with respect to 1 part by mass of component (A) in term, of the transition metal. The component. (B) being contained in an amount less than the upper limit value described above improves the ability of the chemical solution of the present embodiment to remove precious metals. The content of component (B) in teens of transition metal may be $1.0 \times 10^{-3}$ parts by mass or less with respect to 1 part by mass of component (A), may be, $9.0 \times 10^{-6}$ parts by mass or less, may be $8.0 \times 10^{-4}$ parts by mass or less, may be $7.0 \times 10^{-4}$ parts by mass or less, may be $6.0 \times 10^{-4}$ parts by mass or less, may be $5.0 \times 10^{-4}$ part by mass or less, may be $4.0 \times 10^{-4}$ parts by mass or less, may be $3.0 \times 10^{-4}$ parts by mass or less, or may be $2.0 \times 10^{-4}$ parts by mass or less.

The content of component (B) in the chemical solution of the present embodiment may be, in terms of transition metal, $1.0 \times 10^{-15}$ parts by mass or more with respect to 1 part by mass of component (A), may be $5.0 \times 10^{-15}$ parts by mass or more, may be $1.0 \times 10^{-14}$ parts by mass or more, may be $5.0 \times 10^{-14}$ part by mass or more, may be $1.0 \times 10^{-13}$ parts by mass or more, may be $5.0 \times 10^{-13}$ parts by mass or more, may be $1.0 \times 10^{-12}$ parts by mass or more, may be $5.0 \times 10^{-12}$ part, by mass or more, may be $1.0 \times 10^{-11}$ parts by mass or more, may be $5.0 \times 10^{-11}$ parts by mass or more, may be $1.0 \times 10^{-10}$ parts by mass or more, or may be $5.0 \times 10^{-10}$ parts by mass or more.

In a case where there are two or more type of component (B), the content of component (B) described above is the total content of all type, of component (B).

<Water>

The chemical solution of the present embodiment includes water as a solvent for the components described above. The water may include inevitably mixed in trace components. The water used in the chemical solution of the present embodiment is preferably water subjected to a purification process, such as distilled water, ion exchanged water, or ultrapure water and it is more preferable to use ultrapure water commonly used in semiconductor manufacturing.

The content of the water in the chemical solution of the present embodiment is not particularly limited and is preferably 40% by mass or more, more preferably 50% by mass or more, and even more preferably 60% by mass or more. In addition, the upper limit value is not particularly limited and is preferably 99.9% by mass or less, more preferably 99.0% by mass or less, and even more preferably 98.5% by mass or less.

<Other Components>

The chemical solution of the present embodiment may include other components in addition to the components described above, within a range in which the effects of the present invention are not impaired. Examples of other components include pH adjusters, water-soluble organic solvents, surfactants, oxidizing agents other than component (A), anticorrosive agents, buffers, and the like.

pH Adjuster

The chemical solution of the present embodiment may include a pH adjuster in order to adjust the pH of the chemical solution in a range not departing from the purpose of the present invention. The pH adjuster is not particularly limited other than being a component able to adjust the pH of the chemical solution. The added amount of the pH adjuster is optional and the added amount, may be selected to provide the desired pH.

As the pH adjuster, it is possible to use an acidic compound or a basic compound. The acidic compound may be an organic acidic compound or an inorganic acidic compound. Examples of acidic compounds include inorganic acids and salts thereof, such as hydrochloric acid, sulfuric acid, nitric acid, phosphonic acid, sulfonic acid, phosphoric acid, boric acid, hydrobromic acid, and hydroiodic acid; organic acids and salts thereof, such as carbonic acid, carboxylic acids (formic acid, acetic acid, oxaloacetic acid, lactic acid, oxalic acid, malonic acid, succinic acid, tartaric acid, propionic acid, butyric acid, malic acid, citric acid, valeric acid, caproic acid, lauric acid, stearic acid, fumaric acid, maleic acid, pyruvic acid, and the like), organic phosphonic acids, organic sulfonic acid, (alkylsulfonic acids such as methanesulfonic acid and ethanesulfonic acid; fluoroalkylsulfonic acids such as trifluorosulfonic acid; arylsulfonic acids such as p-toluenesulfonic acid and benzenesulfonic acid, and the like), organic phosphoric acids, and organic boric acids, and the like. A hydrogen atom bonded to a carbon atom in the organic acid may be substituted with a substituent or unsubstituted.

The basic compound may be an organic basic compound or an inorganic basic compound. Examples of the organic basic compound include quaternary ammonium salts such as organic quaternary ammonium hydroxide; salts of alkyl amines and derivatives thereof, such as trimethylamine and triethylamine; and the like.

Specific examples of organic quaternary ammonium hydroxides include tetramethylammonium hydroxide (TMAH), bis(2-hydroxyethyl)dimethylammonium hydroxide, tetraethylammonium hydroxide (TEAH), tetrapropylammonium hydroxide, tetrabutylammonium hydroxide, methyltriethylammonium hydroxide, trimethyl(hydroxyethyl)ammonium hydroxide, triethyl(hydroxyethyl)ammonium hydroxide, and the like.

Examples of inorganic basic compounds include inorganic compounds including alkali metals or alkaline earth metals and salts thereof. Specific examples of inorganic basic compounds include lithium hydroxide, sodium hydroxide, potassium hydroxide, rubidium hydroxide, cesium hydroxide, and the like.

The chemical solution of the present embodiment may or may not contain a pH adjuster. The chemical solution of the present embodiment may or may not contain one or more of the compounds described above as specific examples of the pH adjuster. The chemical solution of the present embodiment may or may not contain an acidic compound. The chemical solution of the present embodiment may or may not contain it basic compound.

Water-Soluble Organic Solvent

The chemical solution of the present embodiment may contain a water-soluble organic solvent in a range in which the effects of the present invention are not impaired. Examples of water-soluble organic solvent, include alcohols (for example, methanol, ethanol, ethylene glycol, propylene glycol, glycerin, 1,3-propanediol, 1,3-butanediol, 1,4-butanediol, diethylene glycol, dipropylene glycol, furfuryl alcohol, 1,6-hexanediol, 2-methyl-2,4-pentanediol, and the like), dimethyl sulfoxide, ethers (for example, ethylene glycol dimethyl ether, diethylene glycol dimethyl ether, triethylene glycol dimethyl ether, tetraethylene glycol dimethyl ether, propylene glycol dimethyl ether, diethylene glycol diethyl ether, propylene glycol monomethyl ether, and dipropylene glycol monomethyl ether), ketones (for example, acetone, methyl ethyl ketone, diethyl ketone, methyl isobutyl ketone, cyclohexanone, and isophorone), esters (for example, γ-butyrolactone, ethyl acetate, butyl acetate, propylene carbonate, and δ-valerolactone), and the like.

In a case where the chemical solution of the present embodiment includes a water-soluble organic solvent, the content of the water-soluble organic solvent is preferably 50% by mass or less with respect to the total amount of water and amount of water-soluble organic solvent, more preferably 30% by mass or less, and even more preferably 10% by mass or less. The chemical solution of the present embodiment may not contain a water-soluble organic solvent. The chemical solution of the present embodiment may or may not contain one or more of the compounds described above as specific example, of the water-soluble organic solvent.

Surfactant

The chemical solution of the present embodiment may include a surfactant. By containing a surfactant, it is possible to adjust the wettability of the chemical solution with respect to the substrate. As the surfactant, it is possible to use nonionic surfactants, anionic surfactants, cationic surfactants, or amphoteric surfactants, and the above may be used in combination.

Examples of nonionic surfactants include polyalkylene oxide alkyl phenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, acetylene polyalkylene oxide-based surfactants, and the like.

Examples of anionic surfactants include alkylsulfonic acids, alkylbenzenesulfonic acids, alkyl naphthalene sulfonic acids, alkyldiphenyl ether sulfonic acids, fatty acid amide sulfonic acids, polyoxyethylene alkyl ether carboxylic acids, polyoxyethylene alkyl ether acetic acids, polyoxyethylene alkyl ether propionic acids, alkylphosphonic acid, fatty acid salts, and the like. Examples of the "salt" include ammonium salt, sodium salt, potassium salt, tetramethylammonium salt, and the like.

Examples of cationic surfactants include quaternary ammonium salt-based surfactants, alkylpyridium-based surfactants, and the like.

Examples of amphoteric surfactants include betaine-type surfactants, amino acid-type surfactants, imidazoline-type surfactants, amine oxide-type surfactants, and the like.

These surfactants are generally commercially available. One type of surfactant may be used alone, or two or more type-, may be used in combination.

The chemical solution of the present embodiment may or may not contain a surfactant. The chemical solution of the present embodiment may or may not contain one or more selected from the group consisting of nonionic surfactants, anionic surfactants, cationic surfactants, and amphoteric surfactants. The chemical solution of the present embodiment may or may not contain one or more of the compounds described above as specific examples of the surfactant.

Oxidizing Agents other than Component (A)

In addition to the component (A), the chemical solution of the present embodiment may or may not include other oxidizing agents. Examples of oxidizing agents include transition metal oxides, peroxides, nitrates, nitrites, iodic acids, iodates, periodates, perchlorates, persulfuric acid, persulfates, peracetic acid, peracetic acid salts, permanganate compounds, dichromate compounds, and the like. The chemical solution of the present embodiment may not contain one or more of the compound, described above as specific examples of the oxidizing agent.

Anticorrosive Agent

The chemical solution of the present embodiment may contain an anticorrosive agent.

Examples of anticorrosive agents include compounds including nitrogen-containing heterocycles such as triazole rings, imidazole rings, pyridine rings, phenanthroline rings, tetrazole rings, pyrazole rings, pyrimidine rings, and purine rings.

Examples of compounds including a triazole ring include triazoles such as 1,2,3-triazole, 1,2,4-triazole, 3-amino-1H-1,2,4-triazole, 1-acetyl-1H-1,2,3-triazolo[4,5-b]pyridine, 1H-1,2,3-triazolo[4,5-b]pyridine, 1,2,4-triazolo[4,3-a]pyridine-3(2H)-one, and 3H-1,2,3-triazolo[4,5-b]pyridine-3-ol, benzotriazoles such as 1,2,3-benzotriazole, 5-methyl-1H-benzotriazole, 1-hydroxybenzotriazole, 1-dihydroxypropyl-benzotriazole, 2,3-dicarboxylpropylbenzotriazole, 4-hydroxybenzotriazole, 4-carboxyl-1H-benzotriazole, 4-carboxyl-1H-benzotriazole methyl ester, 4-carboxyl-1H- benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid, and 3-aminotriazole; and the like.

Examples of compounds including an imidazole ring include imidazoles such as 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, and 2-aminoimidazole; biimidazoles such as 2,2'-biimidazole; and the like. Among the above, biimidazole is preferable and 2,2'-biimidazole is more preferable.

Examples of compounds including a pyridine ring include pyridines such as 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetamidopyridine, 4-pyrrolidinopyridine, 2-cyanopyridine, 2,6-pyridinecarboxylic acid, and 2,4,6-trimethylpyridine; bipyridyls such as 2,2'-bipyridyl, 4,4'-dimethyl-2,2'-bipyridyl, 4,4'-di-ten-butyl-2,2'-bipyridyl, 4,4'-dinonyl-2,2'-bipyridyl, 2,2''-bipyridine-6,6'-dicarboxylic acid, and 4,4'-dimethoxy-2,2'-bipyridyl, and the like. Among the above, bipyridyls are preferable and 2,2'-bipyridyl, 4,4'-dimethyl-2,2'-bipyridyl, 4,4'-di-tert-butyl-2,2'-bipyridyl, 4,4'-dinonyl-2,2'-bipyridyl, 2,2''-bipyridine-6,6'-dicarboxylic acid, 4,4'-dimethoxy-2,2-bipyridyl are more preferable.

Examples of compounds including a phenanthroline ring include 1,10-phenanthroline and the like.

Examples of compounds including a tetrazole ring include t H-tetrazole, 5-amino-1H-tetrazole, 5-methyl-1H-tetrazole, 5-phenyl-1H-tetrazole, 1-(2-diaminoethyl)-5-mercaptotetrazole, and the like.

Examples of compounds including a pyrazole ring include 3,5-dimethylpyrazole, 3-amino-5-methylpyrazole, 4-methylpyrazole, 3-amino-5-hydroxypyrazole, and the like.

Examples of compounds including a pyrimidine ring include pyrimidine, 4-methylpyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-1,2,4)triazolo(1,5-a)pyrimidine, 4-aminopyrazolo[3,4-d]pyrimidine, and the like.

Examples of compounds including purine rings include adenine, guanine, hypoxanthine, xanthine, uric acid, theophylline, and the like.

In addition, examples of anticorrosive agents include ascorbic acids such as ascorbic acid, ascorbic acid phosphate, and ascorbic acid sulfate; catechols such as pyrocatechol, 4-tert-butylcatechol, pyrogallol, gallic acid, methyl gallate, 1,2,4-benzenetriol, and tiron; sugars such as fructose, glucose and ribose; and polycarboxylic acids such as polyacrylic acid, polymaleic acid, and copolymers thereof, and the like.

One type of anticorrosive agent may be used alone, or two or more types may be used in combination.

In a case where the chemical solution of the present embodiment contains an anticorrosive agent, the content of the anticorrosive agent is not particularly limited, but is preferably 0.0001% by mass to 10% by mass with respect to the total mass of the chemical solution, more preferably 0.001% by mass to 7% by mass, even more preferably 0.01% by mass to 5% by mass, and particularly preferably 0.1% by mass to 3% by mass.

The chemical solution of the present embodiment may or may not contain an anticorrosive agent. The chemical solution of the present embodiment may not contain one or more selected from the group consisting of nitrogen-containing heterocyclic compounds, ascorbic acids, catechols, sugars, and polycarboxylic acids, and imam not contain one or more of the compounds described above as a specific example of the anticorrosive agent.

<<Buffer>>

The chemical solution of the present embodiment may contain a buffer. A buffer is a compound that has the effect of suppressing changes in the pH of a solution. The buffer is not particularly limited other than being a compound that has a pH buffering ability.

Examples of buffers include weak acids and Good's buffers. Examples of weak acids include acetic acid, citric acid, phosphoric acid, phosphonic acid, boric acid, oxalic acid, malonic acid, succinic acid, glutamic acid, and the like. Examples of Good's buffers include 2-cyclohexylaminoethanesulfonic acid (CHES), 3-cyclohexylaminopropanesulfonic acid (CAPS), N-tris(hydroxymethyl)methyl-3-aminopropanesulfonic acid (TAPS), 4-(cyclohexylamino)-1-butanesulfonic acid (CABS), tricine, bicine, 2-morpholinoethanesulfonic acid-monohydrate (MES), bis(2-hydroxyethyl)aminotris(hydroxymethyl)methane (Bis-Tris), N-(2-acetamido)iminodiacetic acid (ADA), piperazine-1,4-bis(2-ethanesulfonic acid) (PIPES), N-(2-acetamido)-2-aminoethanesulfonic acid (ACES), 2-hydroxy-3-morpholinopropanesulfonic acid (MOPSO), N,N-bis(2-hydroxyethyl)-2-aminoethanesulfonic acid (BES), 3-morpholinopropanesulfonic acid (MOPS), N-tris(hydroxymethyl)methyl-2-aminoethanesulfonic acid (TES), 2-[4-(2-hydroxyethyl)-1-piperazinyl]ethanesulfonic acid (HEPES), 3-[N-tris(hydroxymethyl)methyl amino]-2-hydroxypropanesulfonic acid (TAPSO), piperazine-1,4-bis(2-hydroxypropanesulfonic acid) (POPSO), 4-(2-hydroxyethyl)piperazine-1-(2-hydroxypropane-3-sulfonic acid) (HEPSO), 4-(2-hydroxyethyl)-1-piperazinepropanesulfonic acid (EPPS), and the like.

One type of buffer may be used alone, or two or more types may be used in combination.

In a case where the chemical solution of the present embodiment contains a buffer, the content of the buffer is not particularly limited and examples thereof include 0.001% by mass to 10% by mass with respect to the total mass of the chemical solution, preferably 0.005% by mass to 8% by mass, more preferably 0.01% by mass to 6% by mass, particularly preferably 0.05% by mass to 4% by mass or 0.1% by mass to 3% by mass.

The chemical solution of the present embodiment may or may not contain a buffer. The chemical solution of the present embodiment may or may not contain one or more of the compounds described above as specific examples of the buffer.

The chemical solution of the present embodiment may include a slurry (metal oxide particles) such as used in, for example, a Chemical Mechanical Polishing (CMP) process, or may not include a slurry (metal oxide particles), but preferably not.

Examples of polishing agents include metal oxide particles such as alumina, silica, titania, ceria, and zirconia. The chemical solution of the present embodiment preferably does not include these metal oxide particles.

<<pH>>

The pH of the chemical solution of the present embodiment is not particularly limited. The pH of the chemical solution of the present embodiment is, for example, 5.0 or less. The pH may be 3.0 or less, 2.5 or less, 2.0 or less, 1.5 or less, or 1.0 or less. The pH value is a value measured by a pH meter under conditions of room temperature (25° C.) and normal pressure (1 atmospheric pressure). The pH of the chemical solution of the present embodiment may be less than 1.0. It is possible to calculate a degree of acidity that is less than pH 1.0 in the chemical solution using Hammett's acidity function, for example.

<<Specific Gravity>>

The specific gravity of the chemical solution of the present embodiment is not particularly limited. The specific gravity of the chemical solution of the present embodiment is 0.90 to 1.60. The specific gravity value is a value measured under conditions of room temperature (25° C.) and normal pressure (1 atmospheric pressure). The specific gravity of the chemical solution of the present embodiment may be, for example, 1.55 or less, or 1.50 or less. The specific gravity of the chemical solution of the present embodiment may be, for example, 0.95 or more or 1.00 or more.

<<Impurities and the Like>>

The chemical solution of the present embodiment may include, for example, impurities derived from organic substances (organic impurities). The total content of the organic impurities in the chemical solution of the present embodiment is preferably 5,000 mass ppm or less. The lower limit of the content of the organic impurities is preferably as low as possible, for example, 1 mass ppq or more. The total content of organic impurities is, for example, 1 ppq by mass to 5.000 ppm by mass.

The chemical solution of the present embodiment may include, for example, objects to be counted, which are of a size which is countable using a light scattering particle-in-liquid counter. The size of the objects to be counted is, for example, 0.04 μm or more. The number of objects to be counted in the chemical solution of the present embodiment is, for example, 1,000 or less per 1 mL of the chemical solution and the lower limit value is, for example, 1 or more. It is considered that the effect of suppressing metal corrosion by the chemical solution is improved due to the number of objects to be counted in the chemical solution being within the above range. The size of the objects to be counted may be a size detectable by a light scattering particle-in-liquid counter and may be, for example 0.001 μm or more.

The organic impurities and/or the objects to be counted may be added to the chemical solution, or may be inevitably mixed into the chemical solution during the manufacturing steps of the chemical solution. Examples of cases where organic impurities are inevitably mixed in the manufacturing steps of chemical solutions include cases where organic impurities are included in raw materials (for example, organic solvents) used in the manufacturing of chemical solutions, cases where organic impurities are mixed in from the external environment during the manufacturing steps of chemical solutions (for example, contamination), and the like, without being limited thereto.

In a case of adding objects to be counted to a chemical solution, the abundance ratio may be adjusted for each specific size, taking into consideration the surface roughness and the like of the object to be cleaned.

<Storage Container>

The method for storing the chemical solution of the present embodiment is not particularly limited and it is also possible to use storage containers known in the related art. In order to ensure the stability of the chemical solution, the porosity in the container when storing in the container and/or the type of gas filling the void portions may be appropriately set. For example, the porosity in the storage container is approximately 0.01 to 30% by volume.

When using the chemical solution of the present embodiment, a diluted solution may be obtained by diluting the chemical solution 2 to 2,000 times and then the substrate may be treated using the diluted solution. It is possible to dilute the chemical solution with water, for example.

The content of each component included in the chemical solution of the present embodiment may be a measurement value measured by a measuring device. It is possible to appropriately select a known measuring device depending on the type of component. In a case where the content of the target component is less than the detection limit, the measurement may be performed after appropriately concentrating the chemical solution.

Each component included in the chemical solution of the present embodiment may be purified as appropriate before being blended into the chemical solution. As the purification method, it is possible to use known methods depending on the type of component.

<Application>

The chemical solution of the present embodiment is used to remove precious metals and a substrate including precious metals is set as the treating target. The substrate is not particularly limited other than including a precious metal and examples thereof include a substrate having a precious metal-containing layer (precious metal-containing film). The substrates are not particularly limited and examples thereof include various substrates such as semiconductor wafers, glass substrates for photomasks, glass substrates for liquid crystal displays, glass substrates for plasma displays, substrates for Field Emission Displays (FED), substrates for optical discs, substrates for magnetic disks, and substrates for magneto-optical discs. The substrate is preferably a substrate used for producing semiconductor devices. In addition to the ruthenium-containing layer and the base material of the substrate, the substrate may have, as appropriate, various layers and structures, for example, metal wiring, gate structures, source structures, drain structures, insulating layers, ferromagnetic layers, nonmagnetic layers, and the like. In addition, the uppermost layer on the device surface of the substrate may not be a ruthenium-containing layer and, for example, an intermediate layer of a multilayer structure may be the ruthenium-containing layer.

The size, thickness, shape, layer structure, and the like of the substrate are not particularly limited and are appropriately selectable depending on the purpose.

The precious metal-containing layer is preferably a layer containing a precious metal and more preferably a precious metal film. The thickness of the precious metal-containing layer on the substrate is not particularly limited and is appropriately selectable depending on the purpose. The thickness of the precious metal-containing layer is, for example, in the range of 0.1 to 500 nm, 0.1 to 300 nm, 0.5 to 200 nm, 0.5 to 100 nm, 1 to 100 nm, and 1 to 50 nm.

Precious metals refer to gold (Au), silver (Ag), platinum (Pt), palladium (Pd), rhodium (Rh), iridium (Ir), ruthenium (Ru), osmium (Os), and rhenium (Re). As the precious metal, ruthenium, iridium, or platinum is preferable and ruthenium or platinum is more preferable. The precious metal may be a simple substance of a precious metal, an alloy of precious metals, or a precious metal compound. Examples of precious metal compounds include precious metal oxides, precious metal nitrides, precious metal oxynitrides, and the like. The content of the precious metal in the precious metal-containing layer is preferably 20% by mass or more with respect to the total mass of the composition forming the precious metal-containing layer, more preferably 50% by mass or more, even more preferably 80% by mass or more, and may be 100% by mass. It is possible to form the precious metal-containing layer by a known method, for example, it is possible to use a chemical vapor deposition (CV D) method, an atomic layer deposition (ALD) method, a physical vapor deposition (PVD) method, or the like.

It is possible to suitably use the chemical solution of the present embodiment, for example, for removing a precious metal-containing film on the outer edge of a substrate, removing precious metal-containing substances adhering to the back surface of a substrate, and the like.

<<Removal of Precious Metal-Containing Film on Outer Edge of Substrate>>

The chemical solution of the present embodiment may be used to remove a precious metal-containing film on the outer edge of a substrate on which the precious metal-containing film is arranged. The chemical solution of the present embodiment may be used, for example, to remove a precious metal-containing film positioned at the outer edge in a laminate having a substrate and a precious metal-containing film arranged on the main surface of one side of the substrate.

The precious metal-containing film preferably contains at least one selected the group consisting of a simple substance of a precious metal, a precious metal alloy, a precious metal oxide, a precious metal nitride, and a precious metal oxynitride.

Although the specific method is not particularly limited, examples thereof include a method of supplying the chemical solution from a nozzle such that the chemical solution of the present embodiment comes into contact only with the precious metal-containing film on the outer edge of the substrate. The treating time (contact time between the chemical solution and the wiring substrate) is not particularly limited and examples thereof include 0.01 to 30 minutes, 0.1 to 20 minutes, 0.1 to 10 minutes, 0.15 to 5 minutes, or the like. The treating temperature is not particularly limited and examples thereof include 15 to 75° C., 15 to 65° C., 15 to 55° C., 15 to 50-C, or the like.

<<Removal of Precious Metal-Containing Substances Adhering to Back Surface of Substrate>>

The chemical solution of the present embodiment may be used to remove precious metal-containing substances adhering to the back surface of a substrate on which a precious metal-containing film is arranged. When forming a laminate including a substrate and a precious metal-containing film arranged on the main surface of one side of the substrate, the precious metal-containing film is formed by PVD (for example, sputtering), CVD, or the like. At that time, precious metal-containing substances may adhere to the surface of the substrate on the opposite side (the back surface) to the precious metal-containing film side. The chemical solution of the present embodiment may be used to remove precious metal-containing substances adhering to the back surface of such a laminate.

Although the specific method is not particularly limited, examples thereof include a method in which the chemical solution is discharged such that the chemical solution of the present embodiment comes into contact only with the back surface of the substrate. The suitable ranges for the contact time and the temperature of the chemical solution are the same as described above.

According to the chemical solution of the present embodiment described above, the precious metal removal performance is improved by containing the metal component (B) including a transition metal other than cerium in addition to the cerium-containing oxidizing agent (A) component. Therefore, using the chemical solution of the present embodiment makes it possible to efficiently treat a substrate including a precious metal-containing layer.

(Method for Manufacturing Chemical Solution)

The method for manufacturing a chemical solution according to the second aspect of the present invention includes a step for dissolving the cerium-containing oxidizing agent (A) and the metal component (B) in water to prepare a solution in which a content of the metal component (B), in terms of transition metal, is less than $1.65 \times 10^{-3}$ parts by mass with respect to 1 part by mass of the cerium-containing oxidizing agent (A) (also referred to below as "step (i)"). The chemical solution according to the first aspect is manufactured by the manufacturing method of the present embodiment.

<Step (i)>

Step (i) is a step for dissolving the cerium-containing oxidizing agent (A) and the metal component (B) in water to prepare a solution in which a content of the metal component (B) is less than $1.65 \times 10^{-3}$ parts by mass with respect to 1 part by mass of the cerium-containing oxidizing agent (A).

Component (A) and component (B) are dissolved in water to prepare a solution including component (A) and component (B). At this time, the content of the metal component (B) in the solution is, in terms of transition metal, set to less than $1.65 \times 10^{-3}$ parts by mass with respect to 1 part by mass of the cerium-containing oxidizing agent (A). For example, with respect to 1 part by mass of the added amount of component (A), the added amount of component (B) is, in terms of transition metal, set to less than $1.65 \times 10^{-3}$ parts by mass with respect to 1 part by mass of the cerium-containing oxidizing agent (A). Examples of the content or added amount of component (A) and component (B) include the contents described under "(Chemical Solution)" described above.

In a case of adding an optional component to the chemical solution in addition to component (A) and component (B), the optional component is also dissolved in the solution described above. Examples of optional components include the components described in the section of "<Other Components>" in "(Chemical Solution)" described above.

<Optional Step>

The manufacturing method of the present embodiment may include an optional step in addition to step (i) described above. An example of the optional step is a step of filtering the solution obtained in step (i) using a filter. By performing filter filtration, it is possible to reduce fine particles in the chemical solution and to obtain a high-quality chemical solution.

Examples of filters used for filtration include filters with openings of 0.1 nm or more and 2.0 μm or less. The opening of the filter is preferably 0.5 nm or more and more preferably 1.0 nm or more. The opening of the filter is preferably 1.0 μm or less, more preferably 0.5 μm or less, even more preferably 0.2 μm or less, and particularly preferably 0.1 μm or less.

(Substrate Treating Method)

A method for treating a substrate according to a third aspect of the present invention includes a step of using the chemical solution according to the first aspect, which is brought into contact with a substrate on which a precious metal is exposed on a surface, to remove at least a part of the precious metal from the substrate.

Examples of the substrate on which a precious metal is exposed on the surface include the same examples described in "<Applications>" in "(Chemical Solution)" described above and a substrate having a precious metal-containing layer is a preferable example. The method for forming the precious metal-containing layer on the substrate is not particularly limited and it is possible to use any known method. Examples of such methods include a PVD method (for example, sputtering), a CVD method, a molecular beam epitaxy (MBE) method, an ALD method, and the like. The raw material for the precious metal-containing layer used when forming the precious metal-containing layer on the substrate is also not particularly limited and is appropriately selectable depending on the film-forming method. As the precious metal, ruthenium, iridium, or platinum is preferable and ruthenium or platinum is more preferable.

<Step for Removing at least Part of Precious Metal from Substrate>

The present step is a step for treating a substrate in which a precious metal is exposed on the surface using the chemical solution according to the first aspect described above and includes an operation of bringing the chemical solution into contact with the precious metal exposed on the surface of the substrate. The contact method is not particularly limited and it is possible to use any known contact method. Examples of the contact method include a spray method, a dipping method, a piling method, and the like, without being limited thereto.

In the spray method, for example, the substrate is transported or rotated in a predetermined direction and the chemical solution according to the first aspect is ejected into the space to bring the chemical solution into contact with the substrate. As necessary, the chemical solution may be sprayed while rotating the substrate using a spin coater.

In the dipping method, the substrate is immersed in the chemical solution according to the first aspect and the chemical solution is brought into contact with the substrate.

In the piling method, the chemical solution according to the first aspect is placed on a substrate and the substrate and the chemical solution are brought into contact with each other.

It is possible to appropriately select these methods depending on the structure, material, and the like of the substrate. In the case of the spray method or the piling method, the amount of the chemical solution supplied to the substrate may be any amount with which the surface to be treated on the substrate is sufficiently wetted with the chemical solution.

The purpose of the treatment is not particularly limited and may be microfabrication of the surface to be treated of the substrate including a precious metal (for example, a precious metal-containing layer on the substrate), may be the removal of precious metal-containing deposits adhering to the substrate (for example, a substrate having a precious metal-containing layer), and may be the cleaning of the surface to be treated of the substrate including the precious metal (for example, the precious metal-containing layer on the substrate).

In a case where the purpose of the treatment is microfabrication of the surface to be treated of the substrate including the precious metal, the substrate and the chemical solution are usually brought into contact after covering the locations that are not to be etched with an etching mask.

In a case where the purpose of the treatment is to remove precious metal-containing deposits adhering to the substrate, it is possible to remove the precious metal deposits from the substrate by dissolving the precious metal-containing deposits by bringing the chemical solution according to the first aspect into contact with the substrate.

In a case where the purpose of the treatment is to clean the surface to be treated of the substrate including the precious metal, by bringing the chemical solution according to the first aspect into contact with the surface to be treated of the substrate, the surface to be treated is quickly dissolved and impurities such as particles adhering to the surface of the substrate are removed from the surface of the substrate in a short time.

Specifically, examples of the purpose of the treatment include removing the precious metal-containing film on the outer edge of the substrate and removing precious metal-containing substances adhering to the back surface of the substrate.

The treatment temperature is not particularly limited as long as it is a temperature at which the precious metal dissolves in the chemical solution. The treatment temperature is, for example, 5° C. to 75° C. In all the cases of the spray method, dipping method, and piling method, the removal efficiency is increased by increasing the temperature of the chemical solution; however, it is possible to select the treatment temperature, as appropriate, in consideration of keeping changes in the composition of the chemical solution small and of workability, safety, cost, and the like.

The treatment time may be selected as appropriate depending on the purpose of the treatment, the type and amount of precious metal to be removed (for example, the thickness of the precious metal-containing layer, the amount of precious metal deposits, and the like), and the treatment conditions.

<Optional Step>

The treating method of the present embodiment may include optional steps in addition to the steps described above. Examples of the optional steps include a step for rinsing the substrate, a step for drying the substrate, and the like.

It is possible to perform the rinsing treatment by bringing the rinsing liquid into contact with the substrate. The contact method is not particularly limited and examples thereof include a method for immersing a substrate in a rinsing liquid in a tank, a method for spraying a rinsing liquid onto the surface of a substrate, a method for allowing a rinsing liquid to flow onto the surface of the substrate, a method freely combining these methods, or the like.

Examples of rinsing liquids include hydrofluoric acid, hydrochloric acid, hydrogen peroxide, ammonia, tetramethylammonium hydroxide (TMAH), choline, a mixed liquid of hydrofluoric acid and hydrogen peroxide (FPM), a mixed liquid (SPM) of sulfuric acid and hydrogen peroxide, a mixed liquid of ammonia water and hydrogen peroxide (APM), a mixed liquid of hydrochloric acid and hydrogen peroxide (HPM), a mixed liquid of nitric acid and hydrogen peroxide (NPM), carbon dioxide water, ozone water, hydrogen water, citric acid aqueous solution, sulfuric acid, ammonia water, isopropyl alcohol, hypochlorous acid aqueous solution, ultrapure water, nitric acid, oxalic acid aqueous solution, acetic acid (including an acetic acid aqueous solution), and the like.

Examples of acidic rinsing liquids include a citric acid aqueous solution (preferably 0.01 to 10% by mass citric acid aqueous solution), hydrofluoric acid (preferably 0.001 to 10% by mass hydrofluoric acid), hydrochloric acid (preferably 0.001 to 10% by mass hydrochloric acid), hydrogen peroxide (preferably a 0.05 to 10% by mass hydrogen peroxide and more preferably a 0.3 to 4.5% by mass hydrogen peroxide), a mixed liquid of hydrofluoric acid and hydrogen peroxide (PPM), a mixed liquid of sulfuric acid and hydrogen peroxide (SPM), a mixed liquid of hydrochloric acid and hydrogen peroxide (HPM), a mixed liquid of nitric acid and hydrogen peroxide (NPM), carbon dioxide water (preferably 10 to 1,000 mass ppm carbon dioxide water), ozone water (preferably 5 to 60) mass ppm ozone water), hydrogen water (preferably 0.5 to 20 mass ppm hydrogen water), sulfuric acid (preferably 1 to 10% by mass sulfuric acid aqueous solution), ammonia water (preferably 0.05 to 6% by mass ammonia water), TMAH aqueous solution (preferably 0.05 to 5% by mass TMAH aqueous solution), choline aqueous solution (preferably 0.05 to 5% by mass choline aqueous solution), nitric acid (preferably 0.001 to 20% by mass nitric acid), oxalic acid aqueous solution (preferably a 0.01 to 10% by mass oxalic acid aqueous solution), acetic acid (preferably a 0.01 to 10% by mass acetic acid aqueous solution, or acetic acid stock solution), and the like.

The preferable conditions for FPM. SPM, APM, HPM, and NPM are the same as above.

Hydrofluoric acid, nitric acid, and hydrochloric acid are intended to be aqueous solutions in which HF, $HNO_3$, and HCl are each dissolved in water. Ozone water, carbon dioxide water, ammonia water. TMAH aqueous solution, choline aqueous solution, and hydrogen water are intended to be aqueous solutions in which $O_3$, $CO_2$, $NH_3$, methylammonium hydroxide ($[(CH_3)_4N]^+[OH]^-$), choline (trimethyl-2-hydroxyethylammonium hydroxide; $[(CH_3)_3N(CH_2)_2OH]^+[OH]^-$), and $H_2$ are each dissolved in water.

These rinsing liquids may be mixed for use in a range in which the purpose of the rinsing treatment is not impaired. In addition, the rinsing liquid may include an organic solvent.

The treatment time of the rinsing treatment (the contact time between the rinsing liquid and the substrate) is not particularly limited, but is, for example, 5 seconds to 5 minutes. The temperature of the rinsing liquid during the treatment is not, particularly limited, but, for example, is generally preferably 16° C. to 60° C., and more preferably 18'C to 40° C.

According to the substrate treating method of the present embodiment described above, the chemical solution according to the first aspect is used to treat the substrate on which the precious metal is exposed on the surface, thus, it is possible to efficiently remove the precious metal which is the removal target exposed on the substrate.

(Method for Manufacturing Semiconductor Device)

The method for manufacturing a semiconductor device of the present embodiment includes a step for treating a substrate by the substrate treating method according to the third aspect.

It is possible to perform the step for treating the substrate in the same manner as the method described in "(Substrate Treating Method)" above. The substrate is preferably a substrate having a precious metal-containing layer. As the substrate, it is possible to use a substrate commonly used for producing semiconductor devices.

<Other Steps>

The method for manufacturing a semiconductor device of the present embodiment may include other steps in addition to the treating steps described above. Such other steps are not particularly limited and examples thereof include known steps that are performed when manufacturing semiconductor devices. Examples of such steps include steps for forming various structures such as metal wiring, a gate structure, a source structure, a drain structure, an insulating layer, a ferromagnetic layer, and a nonmagnetic layer (layer formation, etching other than the etching treatment described above, chemical mechanical polishing, reforming, and the like), resist film formation steps, exposure steps, development steps, heat treatment steps, cleaning steps, inspection steps, and the like, without being limited thereto. It is possible to perform these other steps as appropriate before or after the above treating steps, as necessary.

EXAMPLES

A description will be given below of the present invention in more detail using Examples, but the present invention is not limited to these examples.

<Preparation of Chemical Solution>

Examples 1 to 12, Comparative Examples 1 to 7

Each component shown in Table 1 was mixed to prepare a chemical solution for each example.

TABLE 1

|  | Component (A) | | Component (B) | | |
| --- | --- | --- | --- | --- | --- |
|  | Compound | Amount (wt %) | Compound | Amount (wt ppb) | Water |
| Example 1 | $(NH_4)_2Ce(NO_3)_6$ | 2.0 | $La_2(CO_3)_3 \cdot xH_2O$ | 10 | Remainder |
| Example 2 | $(NH_4)_2Ce(NO_3)_6$ | 2.0 | $Pr(NO_3)_3 \cdot 6H_2O$ | 10 | Remainder |
| Example 3 | $(NH_4)_2Ce(NO_3)_6$ | 2.0 | $Nd(NO_3)_3 \cdot 6H_2O$ | 10 | Remainder |
| Example 4 | $(NH_4)_2Ce(NO_3)_6$ | 2.0 | $Sm(NO_3)_3 \cdot 6H_2O$ | 10 | Remainder |
| Example 5 | $(NH_4)_2Ce(NO_3)_6$ | 2.0 | $Y(NO_3)_3 \cdot 6H_2O$ | 10 | Remainder |
| Example 6 | $(NH_4)_2Ce(NO_3)_6$ | 2.0 | $Fe_2(SO_4)_3$ | 10 | Remainder |
| Example 7 | $(NH_4)_2Ce(NO_3)_6$ | 2.0 | $Fe_3O_4$ | 10 | Remainder |
| Example 8 | $(NH_4)_2Ce(NO_3)_6$ | 2.0 | $CuSO_4$ | 10 | Remainder |
| Example 9 | $(NH_4)_2Ce(NO_3)_6$ | 2.0 | $Nd(NO_3)_3 \cdot 6H_2O$ | 0.1 | Remainder |
| Example 10 | $(NH_4)_2Ce(NO_3)_6$ | 2.0 | $Sm(NO_3)_3 \cdot 6H_2O$ | 0.1 | Remainder |
| Example 11 | $(NH_4)_2Ce(NO_3)_6$ | 2.0 | $Y(NO_3)_3 \cdot 6H_2O$ | 0.1 | Remainder |
| Example 12 | $(NH_4)_2Ce(NO_3)_6$ | 2.0 | $Fe_2(SO_4)_3$ | 0.1 | Remainder |
| Comparative Example 1 | $(NH_4)_2Ce(NO_3)_6$ | 2.0 | — | — | Remainder |
| Comparative Example 2 | $(NH_4)_2Ce(NO_3)_6$ | 2.0 | $Nd(NO_3)_3 \cdot 6H_2O$ | 100000 | Remainder |

TABLE 1-continued

| | Component (A) | | Component (B) | | |
|---|---|---|---|---|---|
| | Compound | Amount (wt %) | Compound | Amount (wt ppb) | Water |
| Comparative Example 3 | $(NH_4)_2Ce(NO_3)_6$ | 2.0 | $Sm(NO_3)_3 \cdot 6H_2O$ | 100000 | Remainder |
| Comparative Example 4 | $(NH_4)_2Ce(NO_3)_6$ | 2.0 | $CaCl_2$ | 10 | Remainder |
| Comparative Example 5 | $(NH_4)_2Ce(NO_3)_6$ | 2.0 | NaCl | 10 | Remainder |
| Comparative Example 6 | $(NH_4)_2Ce(NO_3)_6$ | 2.0 | $CaCl_2$ | 0.1 | Remainder |
| Comparative Example 7 | $(NH_4)_2Ce(NO_3)_6$ | 2.0 | NaCl | 0.1 | Remainder |

Table 2 shows the content of component (B) in terms of transition metals in the chemical solutions of each example. The above is expressed as parts by mass with respect to 1 part by mass of component (A).

TABLE 2

| | Transition metal | Amount of component (B) in terms of transition metal (parts by mass) |
|---|---|---|
| Example 1 | La | $1.45 \times 10^{-07}$ |
| Example 2 | Pr | $1.60 \times 10^{-07}$ |
| Example 3 | Nd | $1.65 \times 10^{-07}$ |
| Example 4 | Sm | $1.70 \times 10^{-07}$ |
| Example 5 | Y | $1.15 \times 10^{-07}$ |
| Example 6 | Fe | $7.00 \times 10^{-08}$ |
| Example 7 | Fe | $1.20 \times 10^{-07}$ |
| Example 8 | Cu | $2.00 \times 10^{-07}$ |
| Example 9 | Nd | $1.65 \times 10^{-09}$ |
| Example 10 | Sm | $1.70 \times 10^{-09}$ |
| Example 11 | Y | $1.15 \times 10^{-09}$ |
| Example 12 | Fe | $7.00 \times 10^{-10}$ |
| Comparative Example 1 | — | — |
| Comparative Example 2 | Nd | $1.65 \times 10^{-03}$ |
| Comparative Example 3 | Sm | $1.70 \times 10^{-03}$ |
| Comparative Example 4 | Ca | $1.35 \times 10^{-03}$ |
| Comparative Example 5 | Na | $1.95 \times 10^{-07}$ |
| Comparative Example 6 | Ca | $1.35 \times 10^{-09}$ |
| Comparative Example 7 | Na | $1.95 \times 10^{-09}$ |

<Substrate Treating>

A ruthenium substrate was used in which a ruthenium film (thickness: 30 nm) was formed on a 12-inch silicon substrate using the CVD method. An etching treatment was performed by putting the chemical solution of each example into a beaker and immersing the ruthenium substrate in the chemical solution of each example for 3 minutes at room temperature 25° C.). During the etching treatment, the beaker was stirred at 300 rpm. After the etching treatment, the ruthenium substrate was taken out from the chemical solution, washed with water, and dried by nitrogen blowing.

The film thickness of the ruthenium substrate was measured before immersion in the chemical solution and after immersion in the chemical solution. A fluorescent X-ray analysis (XRF) device (ZSX Primus IV, Rigaku) was used to measure the film thickness. The etching rate was calculated from the change in the film thickness of the ruthenium film before and after the etching treatment. Using the etching rate (standard ER) in Comparative Example 1 as a standard, the etching rate increase rate (ER increase rate) in each example was calculated using the following equation. The results are shown in Table 3.

ER increase rate (%)=(ER−standard ER)/standard ER×100

TABLE 3

| | ER increase rate (%) |
|---|---|
| Example 1 | 9% |
| Example 2 | 9% |
| Example 3 | 40% |
| Example 4 | 32% |
| Example 5 | 10% |
| Example 6 | 21% |
| Example 7 | 26% |
| Example 8 | 17% |
| Example 9 | 38% |
| Example 10 | 24% |
| Example 11 | 19% |
| Example 12 | 8% |
| Comparative Example 1 | — |
| Comparative Example 2 | −11% |
| Comparative Example 3 | −9% |
| Comparative Example 4 | −3% |
| Comparative Example 5 | −7% |
| Comparative Example 6 | −6% |
| Comparative Example 7 | 0% |

From the results shown in Table 3, it was confirmed that the chemical solutions of Examples 1 to 12 increased the etching rate of ruthenium compared to the chemical solutions of Comparative Examples 1 to 7. From these results, it was confirmed that the removal performance of precious metals such as ruthenium was improved due to component (B) being contained in a predetermined range in the chemical solution.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chemical solution for removing a precious metal, the chemical solution comprising:
   a cerium-containing oxidizing agent (A);
   a metal component (B) including a transition metal other than cerium; and
   water,
   wherein a content of the metal component (B) is less than $1.65 \times 10^{-3}$ parts by mass with respect to 1 part by mass of the cerium-containing oxidizing agent (A) in terms of the transition metal.

2. The chemical solution according to claim 1, wherein the precious metal is ruthenium, iridium, or platinum.

3. The chemical solution according to claim 1, wherein the metal component (B) includes at least one transition metal selected from the group consisting of lanthanum, praseodymium, neodymium, samarium, yttrium, iron, and copper.

4. A method for manufacturing the chemical solution according to claim 1, the method comprising:
   dissolving the cerium-containing oxidizing agent (A) and the metal component (B) in water to prepare a solution in which a content of the metal component (B) is less than $1.65 \times 10^{-3}$ parts by mass with respect to 1 part by mass of the cerium-containing oxidizing agent (A) in terms of the transition metal.

5. A method for treating a substrate, the method comprising:
   bringing the chemical solution according to claim 1 into contact with a substrate on which a precious metal is exposed on the surface to remove at least a pan of the precious metal from the substrate.

6. A method for manufacturing a semiconductor device, the method comprising:
   treating a substrate by the method for treating a substrate according to claim 5.

* * * * *